United States Patent

Satoh et al.

[11] Patent Number: 5,874,866
[45] Date of Patent: Feb. 23, 1999

[54] PHASE-SHIFT OSCILLATOR HAVING LADDER-TYPE SAW FILTER FEEDBACK CIRCUIT

[75] Inventors: Yoshio Satoh; Osamu Ikata; Takashi Matsuda, all of Kawasaki; Yoshitaka Takahashi, Yokohama, all of Japan; Ivan Dimitrov Avramov, Sofia, Bulgaria

[73] Assignees: Fujitsu Limited; Fujitsu Towa Electron Limited, both of Kanagawa, Japan

[21] Appl. No.: 937,380

[22] Filed: Sep. 25, 1997

[30] Foreign Application Priority Data

May 13, 1997 [JP] Japan .................................. 9-122493

[51] Int. Cl.$^6$ ...................................................... H03B 5/32
[52] U.S. Cl. ........................ 331/107 A; 331/135; 333/193
[58] Field of Search ............................ 331/107 A, 108 B, 331/135; 333/193

[56] References Cited

U.S. PATENT DOCUMENTS

| 4,325,032 | 4/1982 | Gilden | 331/107 A |
| 5,654,680 | 8/1997 | Kwan et al. | 333/195 |
| 5,719,537 | 2/1998 | Matsui et al. | 333/193 |

*Primary Examiner*—Siegfried H. Grimm
*Attorney, Agent, or Firm*—Nikaido, Marmelstein, Murray & Oram LLP

[57] ABSTRACT

An oscillation circuit of phase-shift type includes a surface acoustic wave filter in a feedback circuit, the surface acoustic wave filter having first and second one-port surface acoustic wave resonators of different resonance frequencies connected in a ladder configuration. The oscillation circuit has a high C/N ratio with a large bandwidth of variable frequency and can be fabricated in a small size with low costs.

12 Claims, 24 Drawing Sheets

FIG. 10

| resonator | number of pairs | aperture length | number of pairs in reflector | IDT period | capacitance Co | Cop/Cos |
|---|---|---|---|---|---|---|
| $R_{S1}$, $R_{S2}$, $R_{S3}$ | 150 pairs | 75 μm | 50 pairs | 4.12 μm | (Cos) 4.5 pF | 0.58 |
| $R_{P1}$, $R_{P2}$, $R_{P3}$ | 40 pairs | 162 μm | 50 pairs | 4.30 μm | (Cop) 2.6 pF | |

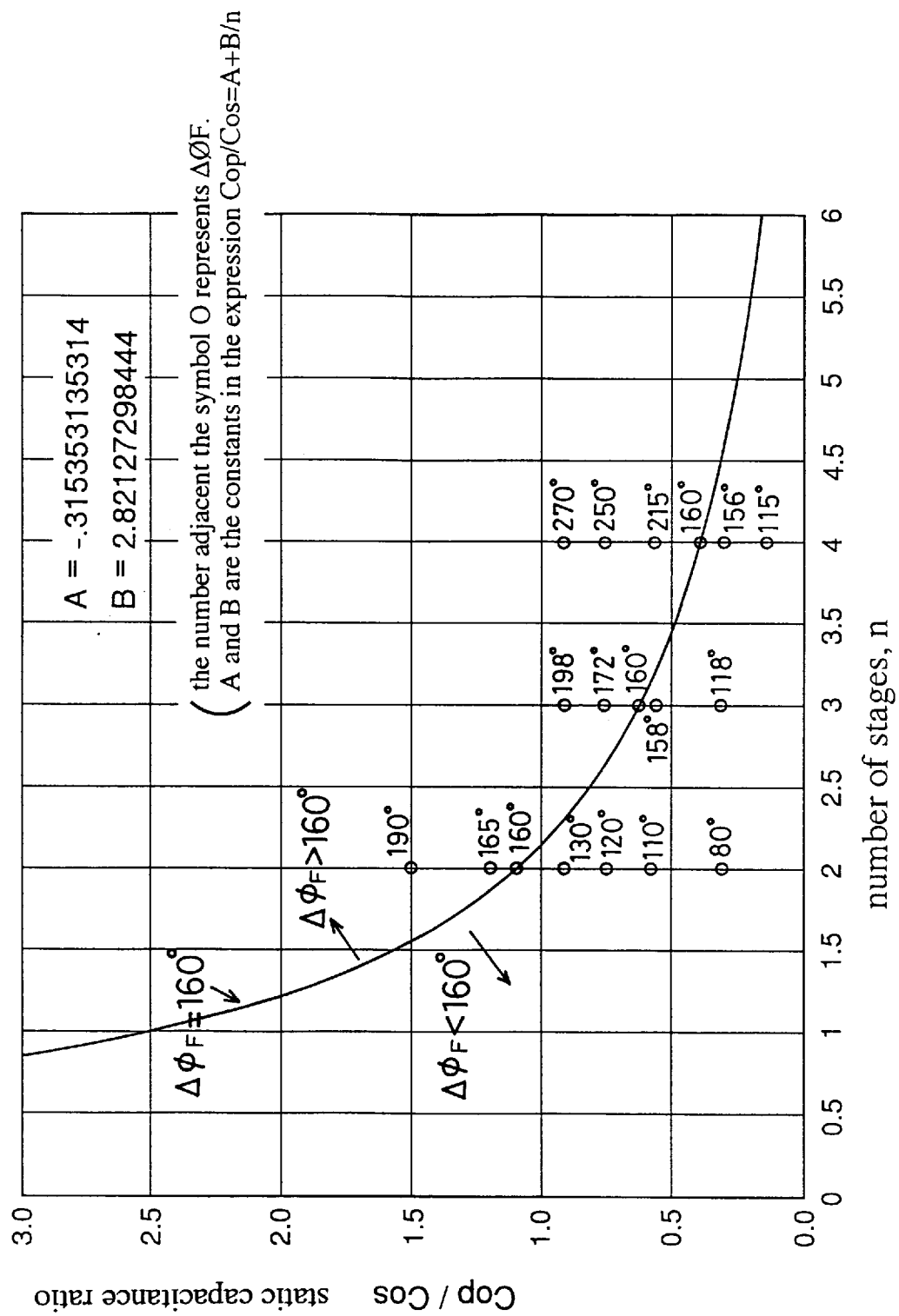

PHASE-SHIFT OSCILLATOR HAVING LADDER-TYPE SAW FILTER FEEDBACK CIRCUIT

BACKGROUND OF THE INVENTION

1. Field of the Invention

The present invention relates to an oscillation circuit, and more particularly to an oscillation circuit of phase-shift type employing a surface acoustic wave device.

2. Description of the Related Arts

Oscillation circuits with less noise which employ a resonator having a large Q value are used in various fields of electronic industries. There are two types of oscillation circuits: one is an oscillation circuit with a fixed frequency, and the other is an oscillation circuit of voltage controlled type whose oscillation frequency can be varied with an external voltage (hereafter referred to as VCO: Voltage Controlled Oscillator). Oscillation circuits of voltage controlled type are used in various electronic apparatus and, recently, there has been a need for oscillation circuits of voltage controlled type having a high C/N ratio with a large bandwidth of variable frequency especially in the fields of mobile communication and optical communication. Particularly, it is required that oscillation circuits of voltage controlled type demanded in the mobile communication terminal such as a car phone or a portable phone are provided in a smaller size and with lower costs. In view of this, oscillation circuits of phase-shift type are a prospect among the oscillation circuits of voltage controlled type.

Conventionally, oscillation circuits employing a dielectric resonator or VCOs employing a micro strip line as a resonator are used in the field of mobile communication. However, the former is provided in a large size with high costs, and therefore is not suitable as a VCO for mobile communication. The latter can be provided in a small size with low costs and can be furnished with a large bandwidth of variable frequency, but it cannot have a large C/N ratio because the Q value is low.

Also, there were reports on VCOs employing a surface acoustic wave resonator (SAW) or a surface acoustic wave filter (hereafter referred to as a SAW filter). Oscillation circuits employing a quartz as a material for the substrate of a SAW filter have a high Q value and excellent C/N ratio but the frequency range that can be controlled with voltage is narrow.

In order to overcome the aforementioned problems, oscillation circuits are proposed in which a piezoelectric single crystal having a large electromechanical coupling factor is used as a substrate material. For example, there have been reports on an oscillation circuit employing $LiTaO_3$ ("Surface acoustic wave oscillation circuits with a large bandwidth of variation" (Kouichi Sugawara and Bunji Yamamoto, Technical reports by Electronic Data Communication Society, US78-12, pp. 21–28) and on an oscillation circuit employing $LiNbO_3$ ("Review on voltage controlled oscillation circuits for mobile wireless transceivers employing a SAW resonator" (Mitsutaka Hikida, Junji Sumioka, and Yukinari Fujiwara, Technical reports by Electronic Data Communication Society, MW90-102, pp. 15–20).

However, conventional VCOs employing a SAW device (a SAW filter or a SAW resonator) having a substrate with a high electromechanical coupling factor are accompanied by the following problems.

(1) A VCO having a one-port SAW resonator formed on a $LiNbO_3$ substrate

FIG. 21 shows a structural view of a conventional one-port SAW resonator. The one-port SAW resonator includes an IDT (interdigital transducer) and reflectors. The IDT is disposed at the center of the resonator and composed of finger-like electrodes. The reflectors are disposed on both sides of the IDT. FIG. 22 shows impedance-frequency characteristics of this one-port SAW resonator, in which the vertical axis represents an imaginary part of the impedance, fr being a resonance frequency and fa being an anti-resonance frequency.

FIG. 23 is a circuit diagram of a VCO employing a one-port SAW resonator. In principle, this VCO has a variable frequency within the range from the resonance frequency fr to the anti-resonance frequency fa of the resonator, as shown in FIG. 22. The frequency difference fa-fr is determined by the capacitance ratio γ of the resonator and is a value substantially determined by the electromechanical coupling factor of the substrate material (piezoelectric single crystal) for the SAW resonator. In other words, the difference fa-fr increases in accordance with the increase in the electromechanical coupling factor, whereby the bandwidth of variable frequency as a VCO will be larger.

Therefore, a variable frequency bandwidth of about 2.5% in terms of fractional bandwidth is conventionally realized by employing a $LiNbO_3$ substrate having a large electromechanical coupling factor. However, a variable frequency bandwidth of about 3 to 3.5% in terms of fractional bandwidth is required in the field of mobile communication, especially of portable phones and wireless LAN, so that the conventional VCO could not be used in this field.

(2) A VCO employing a transversal SAW filter formed on a $LiTaO_3$ substrate.

FIG. 24 shows a circuit diagram of a VCO employing a conventional transversal SAW filter. This VCO has a transversal SAW filter formed on a $LiTaO_3$ substrate as shown in FIG. 24. The SAW filter is disposed at the feedback circuit portion of a phase-shift oscillation circuit for obtaining an oscillation. In this case, it is possible to enlarge the variable frequency bandwidth in principle by reducing the number of electrode pairs of the transversal filter and decreasing the delay distance between the input and output electrodes.

However, there is a problem that ripple in band inevitably occurs due to the TTE wave (Triple Transit Echo: the delayed wave generated by triple reflection in the SAW filter between the input and output electrodes), thus failing to satisfy the condition for stable oscillation. Also, in this example, the reduction of the number of electrode pairs is limited in view of preventing the side lobe, so that the obtained bandwidth of variable frequency was a fractional bandwidth of only about 2.5%.

SUMMARY OF THE INVENTION

The present invention provides an oscillation circuit of phase-shift type comprising a surface acoustic wave filter in a feedback circuit, the surface acoustic wave filter having first and second one-port surface acoustic wave resonators of different resonance frequencies connected in a ladder configuration.

The oscillation circuit is characterized in that the surface acoustic wave filter includes a plurality of the first one-port surface acoustic wave resonators disposed in a parallel arm and a plurality of the second one-port surface acoustic wave resonators disposed in a series arm, wherein each of the first one-port surface acoustic wave resonators has a predetermined resonance frequency $f_{rp}$ and an anti-resonance frequency $f_{ap}$, and each of the second one-port surface acoustic wave resonators has a resonance frequency $f_{rs}$ approximately equal to the anti-resonance frequency $f_{as}$."

According to the present invention, it is possible to provide an oscillation circuit which has a high C/N ratio with a large bandwidth of variable frequency and which can be fabricated in a small size with low costs.

BRIEF DESCRIPTION OF THE DRAWINGS

FIG. 10 is a chart showing numerical values of the components of each SAW resonator illustrated in FIG. 9.

FIG. 15 is a graph showing the phase variation width relative to Cop/Cos and n according to one embodiment of the present invention.

DETAILED DESCRIPTION OF THE PREFERRED EMBODIMENTS

In the surface acoustic wave filter according to the present invention, the resonance frequency $f_{rs}$ of the second one-port surface acoustic wave resonator in the series arm may be larger than the anti-resonance frequency $f_{ap}$ of the first one-port surface acoustic wave resonator in the parallel arm and a value obtained by normalizing a difference $\Delta f = f_{rs} - f_{ap}$ with the resonance frequency $f_{rs}$ may be greater than 0 and smaller than α which is given by the following formula:

$$\alpha = 1/\left(\sqrt{Cop(\gamma^2 + \gamma)/(0.06 \cdot Cos)}\right) - \gamma$$

Here, Cop represents a static capacitance of the first one-port surface acoustic wave resonator in the parallel arm, Cos represents a static capacitance of the second one-port surface acoustic wave resonator in the series arm, and γ represents a capacitance ratio.

Also, the first one-port surface acoustic wave resonator and the second one-port surface acoustic wave resonator may be designed to satisfy the following inequality:

$$Cop/Cos < -0.32 + 2.82/n,$$

wherein n is the number of stages connected in cascade configuration when the first one-port surface acoustic wave resonator and the second one-port surface acoustic wave resonator are counted as a pair.

Further, an arithmetic mean of Cop/Cos in the stages may be smaller than −0.32+2.82/n if the value Cop/Cos of the pair of the first and second one-port surface acoustic wave resonators differs from stage to stage.

Also, in the present invention, a phase change of phase characteristics in the passband of the surface acoustic wave filter may be within the range of 0 degrees to 160 degrees.

Furthermore, the surface acoustic wave filter is preferably formed on a piezoelectric single-crystal substrate of $LiTaO_3$, $LiNbO_3$, or $KNbO_3$ in view of obtaining a large bandwidth of variable frequency.

The surface acoustic wave filter for use in the present invention is a filter in which one-port surface acoustic wave resonators are connected in a ladder configuration as disclosed for example in Japanese Unexamined Patent Publication No. Hei 05(1993)-183380 or No. Hei 06(1994)-069750. This surface acoustic wave filter is hereafter referred to as a ladder-type SAW filter.

Figure 1:
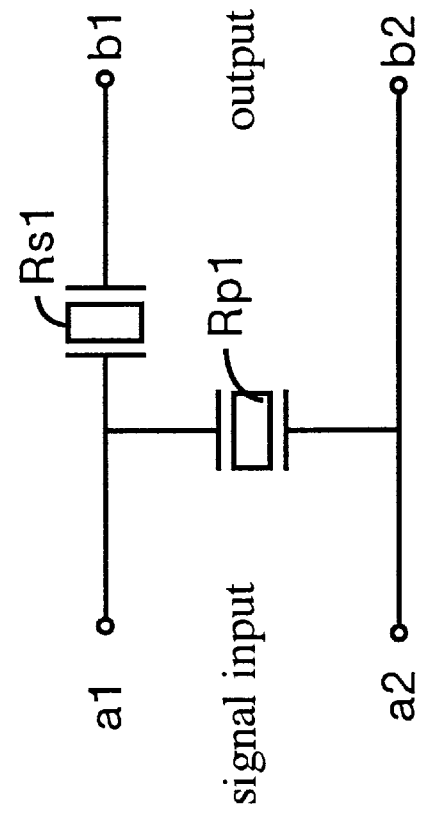
FIG. 1 is a view showing a construction of a ladder-type SAW filter (the construction of a basic unit) according to the present invention.
Figure 2:
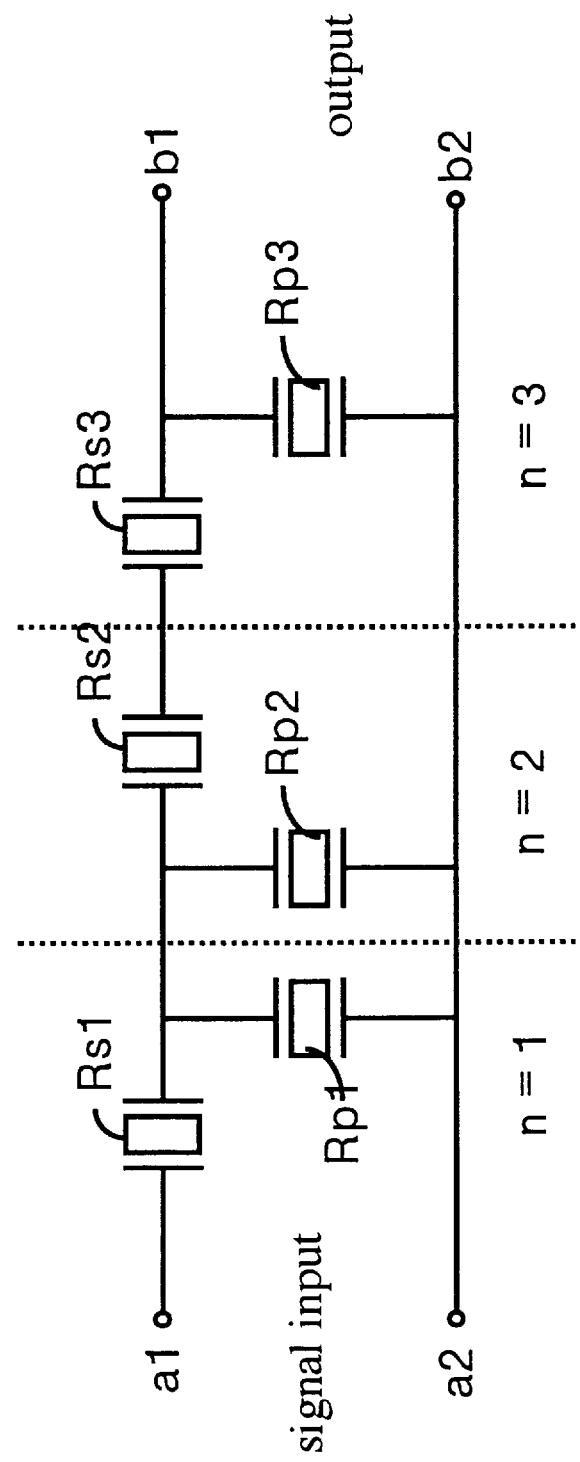
FIG. 2 is a view showing a construction of a ladder-type SAW filter (the construction of a multi-stage connection) according to the present invention.

FIGS. 1 and 2 are views showing a configuration of a ladder-type SAW filter of the present invention. FIG. 1 shows a configuration of a basic unit of the ladder-type SAW filter. Here, the one-port surface acoustic wave resonator Rs1 in a series arm (hereafter referred to as "series arm SAW resonator") is disposed in series on one side of the electric terminals for signal input and output. The one-port surface acoustic wave resonator Rp1 in a parallel arm (hereafter referred to as "parallel arm SAW resonator") is disposed in parallel at a position connecting the electric terminals for signal input and output. The static capacitance of the series arm SAW resonator Rs1 will be represented by Cos and the static capacitance of the parallel arm SAW resonator Rp1 will be represented by Cop.

FIG. 2 shows a configuration in which the basic units of FIG. 1 are connected in three stages (n=3). The series arm SAW resonators Rs1, Rs2, and Rs3 are connected in series and the parallel arm SAW resonators Rp1, Rp2, and Rp3 are connected in parallel. The principle of operation in this configuration showing filter characteristics shall be omitted here, since it is described in detail in Japanese Unexamined Patent Publication No. Hei 05(1993)-183380 by the inventors of the present application.

Figure 3A:
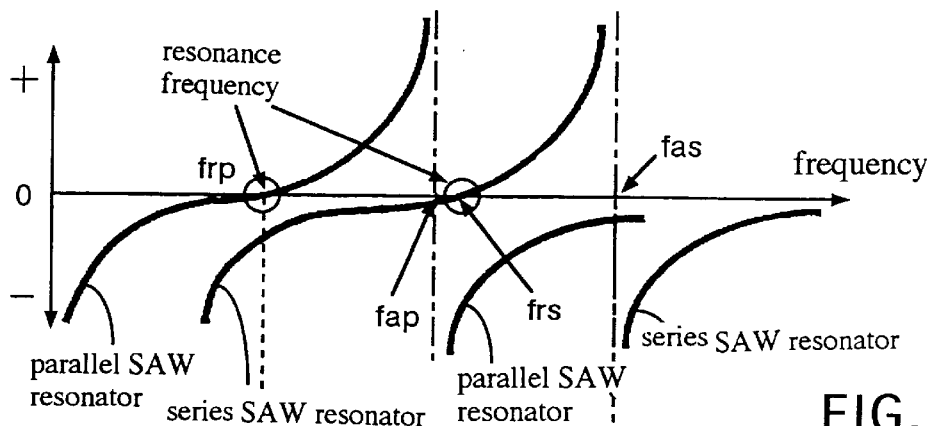
FIG. 3(a) is a graph showing characteristics of a ladder-type SAW filter according to the present invention.

FIG. 3(a) shows a relationship between the impedance characteristics of the parallel arm SAW resonator and the impedance characteristics of the series arm SAW resonator constituting the ladder configuration of the present invention. As shown in FIG. 3(a), the present invention is characterized in that the anti-resonance frequency $f_{ap}$ of the parallel arm SAW resonator is approximately equal to the resonance frequency $f_{rs}$ of the series arm SAW resonator. Alternatively, the filter of the present invention may be designed so that the resonance frequency $f_{rs}$ is a little larger than the anti-resonance frequency $f_{ap}$.

Figure 3B:
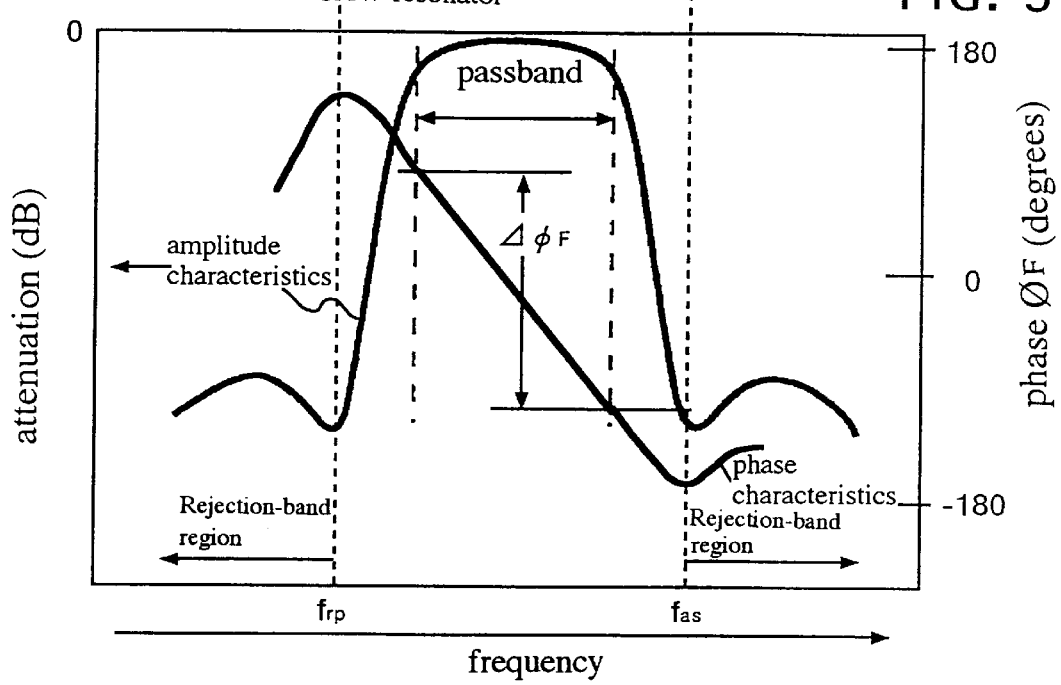
FIG. 3(b) is a graph showing characteristics of a ladder-type SAW filter according to the present invention.

Once the above-mentioned frequency condition is satisfied, it is possible to obtain pass characteristics as a filter with a wide frequency range from a frequency near the resonance frequency $f_{rp}$ of the parallel arm SAW resonator up to a frequency near the anti-resonance frequency $f_{as}$ of the series arm SAW resonator, as shown in FIG. 3(b). In other words, a ladder-type SAW filter can be fabricated having a larger bandwidth of variable frequency.

However, if the frequency difference $\Delta f = f_{rs} - f_{ap}$ is too large, the pass characteristics of the ladder-type SAW filter will be deteriorated. In other words, the loss near the center frequency of the passband of the filter will begin to increase. If the loss near the center frequency increases, the later-mentioned "amplitude condition for oscillation" will not be satisfied, whereby the oscillation will be terminated. Therefore, the frequency difference $\Delta f$ can be increased only up to a degree such that the loss begins to occur. The upper limit $\alpha$ for the normalized value $\Delta f/f_{rs}$ is given by the following formula.

$$0 < \Delta f/f_{rs} < \alpha$$

where $$\alpha = 1 / \left( \sqrt{Cop(\gamma^2 + \gamma)/(0.06 \cdot Cos)} \right) - \gamma$$

Here, Cop represents a static capacitance of the parallel arm SAW resonator, Cos represents a static capacitance of the series arm SAW resonator, and $\gamma$ represents a capacitance ratio of the resonators determined by the substrate material (the capacitance ratio=Cop/C1p=Cos/C1s, wherein C1p and C1s are an equivalent series capacitance (motional capacitance) of each resonator). The value of $\gamma$ is about 15 in case of the 36 degree to 42 degree Y-cut, X-propagation LiTaO$_3$. The theoretical basis of the upper limit $\alpha$ is described in detail in Japanese Unexamined Patent Publication No. Hei 05(1993)-183380.

Next, the condition for obtaining an oscillation circuit by employing this ladder-type SAW filter is now described. The ladder-type SAW filter is a two-port element having two electric terminal pairs as shown in FIG. 1. Therefore, the oscillation circuit employing a ladder-type SAW filter is most appropriately constructed as a phase-shift oscillation circuit shown in FIG. 4.

Figure 4:
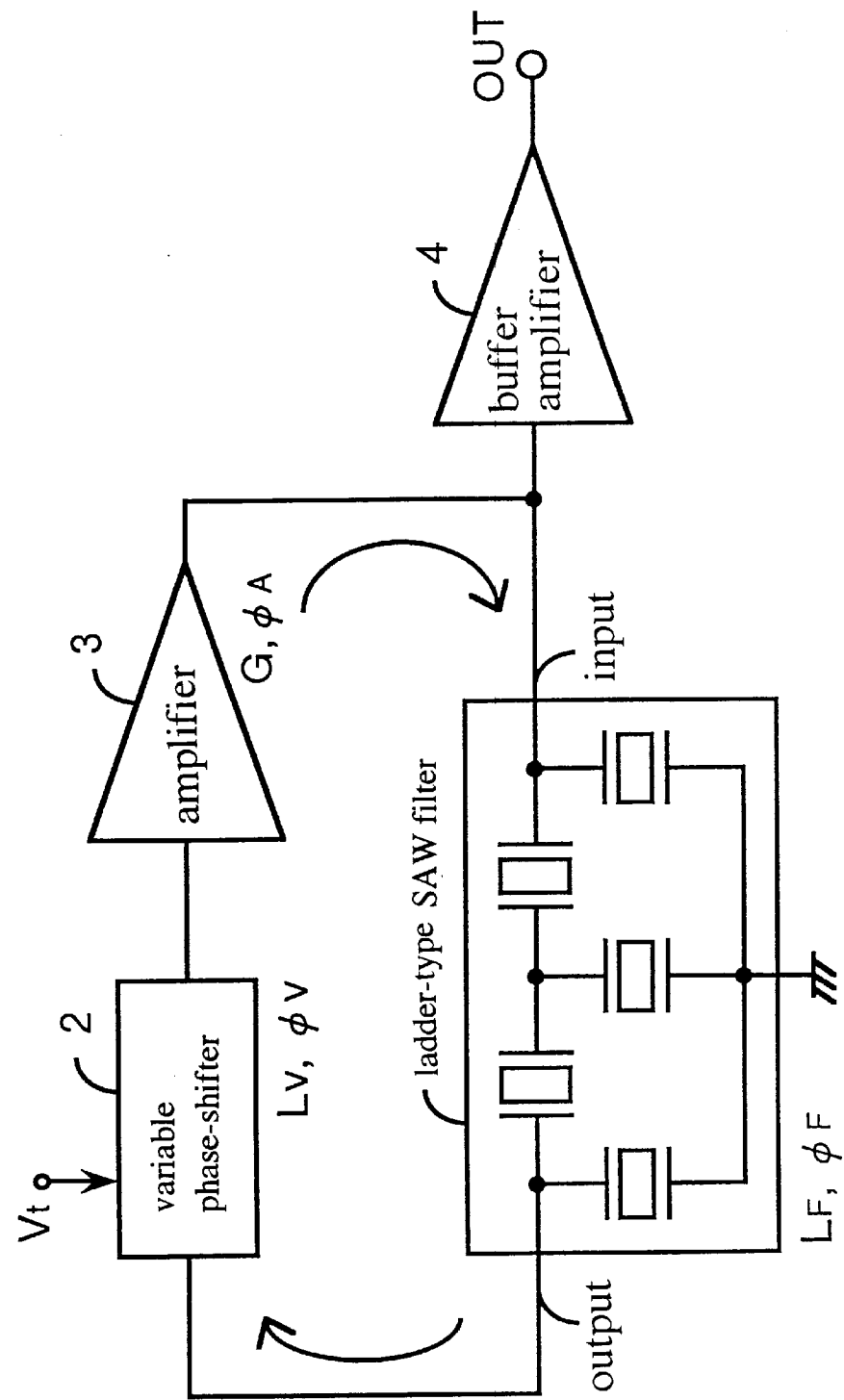
FIG. 4 is a schematic view showing a construction of a phase-shift oscillation circuit according to one embodiment of the present invention.

FIG. 4 is a schematic view showing a construction of a phase-shift oscillation circuit according to one embodiment of the present invention. With reference to FIG. 4, the principle of oscillation is now explained. Referring to FIG. 4, the oscillation circuit is composed of a ladder-type SAW filter 1, a phase-shifter 2, an amplifier 3, and a buffer amplifier 4. Here, in particular, the ladder-type SAW filter 1, the phase-shifter 2, and the amplifier 3 constitute a feedback circuit section of the oscillation circuit. An oscillation signal of desired frequency is generated in this feedback circuit section.

Figure 24:
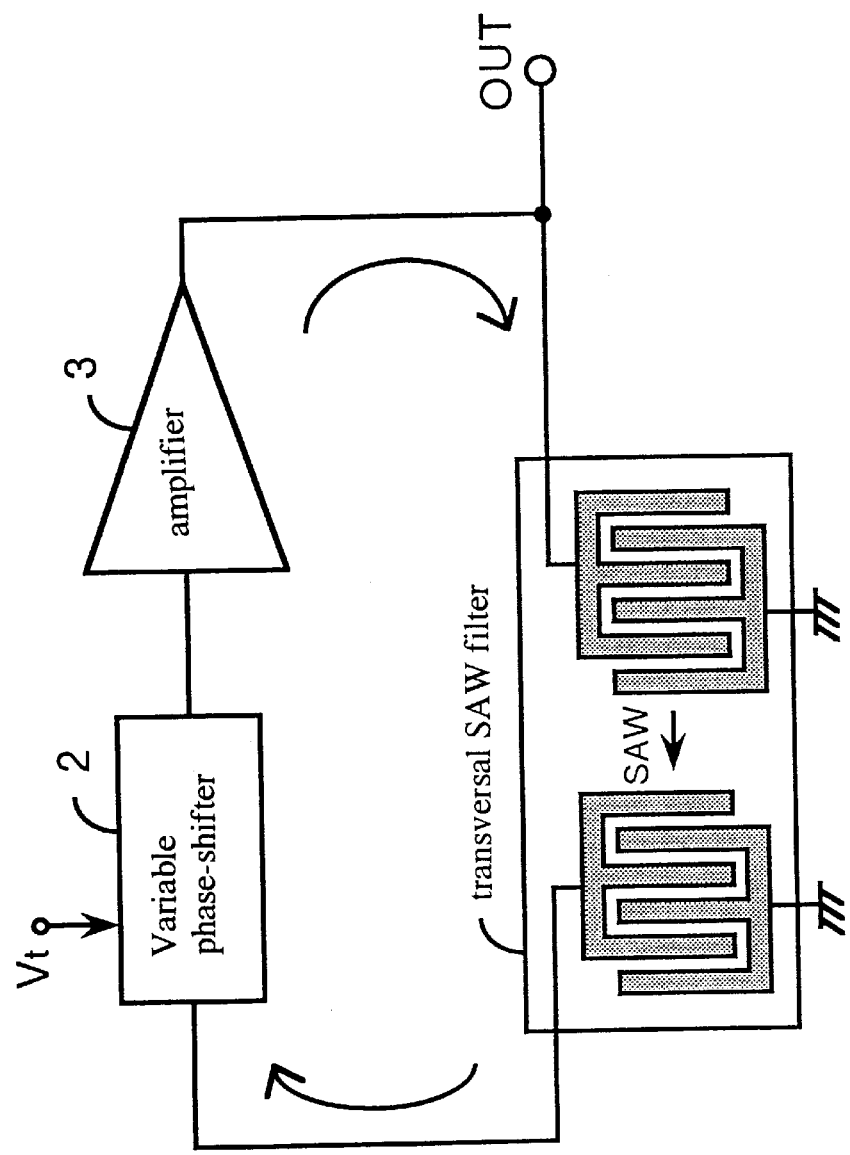
FIG. 24 is a circuit diagram of VCO employing a conventional transversal SAW filter.

For the conventional VCO shown in FIG. 24, a transversal SAW filter is used in the feedback circuit section. For the oscillation circuit of the present invention shown in FIG. 4, a ladder-type SAW filter is used in the feedback circuit section.

The phase-shifter 2 is a section in which a control voltage Vt is inputted from outside and a phase change in the oscillation signal is determined. The phase-shifter 2 may be composed of a varactor diode, an inductor, a resistor, and the like, as mentioned later. The ladder-type SAW filter 1 performs a function of passing only an oscillation signal with a frequency being within a predetermined passband.

After passing through the passband of the ladder-type SAW filter 1, the oscillation signal passes through the phase-shifter 2, is power-amplified in the amplifier 3 composed of active elements such as transistors, and returns to the ladder-type SAW filter 1. Thus, the oscillation signal circulates in a loop and is taken out as an output from a portion of the feedback section through the buffer amplifier 4.

For obtaining a stable oscillation of such phase-shift oscillation circuit, the following conditions must be satisfied with respect to the amplitude and the phase of the oscillation signal.

*Amplitude condition:* $L_F + L_V < G$ *(dB)* (1)

*Phase condition:* $\Phi_F + \Phi_V + \Phi_A = 2n\pi$ *(radian)* (2)

Here, the loss in the ladder-type SAW filter 1 is represented by $L_F$ (dB), the loss in the variable phase-shifter 2 by $L_V$, the gain in the amplifier 3 by G (dB), the phase change in the ladder-type SAW filter 1 by $\Phi_F$ (radian), the phase change in the variable phase-shifter 2 by $\Phi_V$ (radian), the phase change in the amplifier 3 by $\Phi_A$, and n is an arbitrary integer.

Regarding these relationships, when the phase $\Phi_V$ of the variable phase-shifter 2 is changed with an external voltage Vt, the equation (2) is not satisfied. At this time, the oscillation frequency of the ladder-type SAW filter changes in accordance with the phase characteristics shown in FIG. 3(b), so that the phase $\Phi_F$ automatically changes, thereby satisfying the condition of the equation (2). At this time, the amplitude characteristics at that oscillation frequency must satisfy the relationship of (1) and it is required that the loss $L_F$ of the filter is small and does not change so much with respect to the desired range of variable frequency ($f_{rp}$ to $f_{as}$), as shown in the amplitude characteristics of FIG. 3(b). Therefore, it is preferable to obtain a bandwidth of variable frequency with a small change in loss by making the variation $\Delta\Phi_F$ of the phase $\Phi_F$ as small as possible. As a result of this, it is possible to obtain a wide range of change in the oscillation frequency alone without changing the output power so much. This is the basic principle of the phase-shift oscillation circuit.

Next, a method is now explained for changing the control voltage Vt to change the phase $\Phi_V$ of the variable phase-shifter 2 for obtaining a wider bandwidth of variable frequency actually in the oscillation circuit. In principle, if the change in the phase $\Phi_F$ is less than $2\pi$ (360 degrees) within the passband of the ladder-type SAW filter, a stable oscillation is obtained because the frequency condition for oscillation within the passband is unique. However, it is generally difficult to obtain a variation width of $2\pi$ in the phase $\Phi_V$ of the variable phase-shifter 2, so that the passband cannot be fully utilized if the phase variation width $\Delta\Phi_F$ of the ladder-type SAW filter is near $2\pi$.

Figure 5:
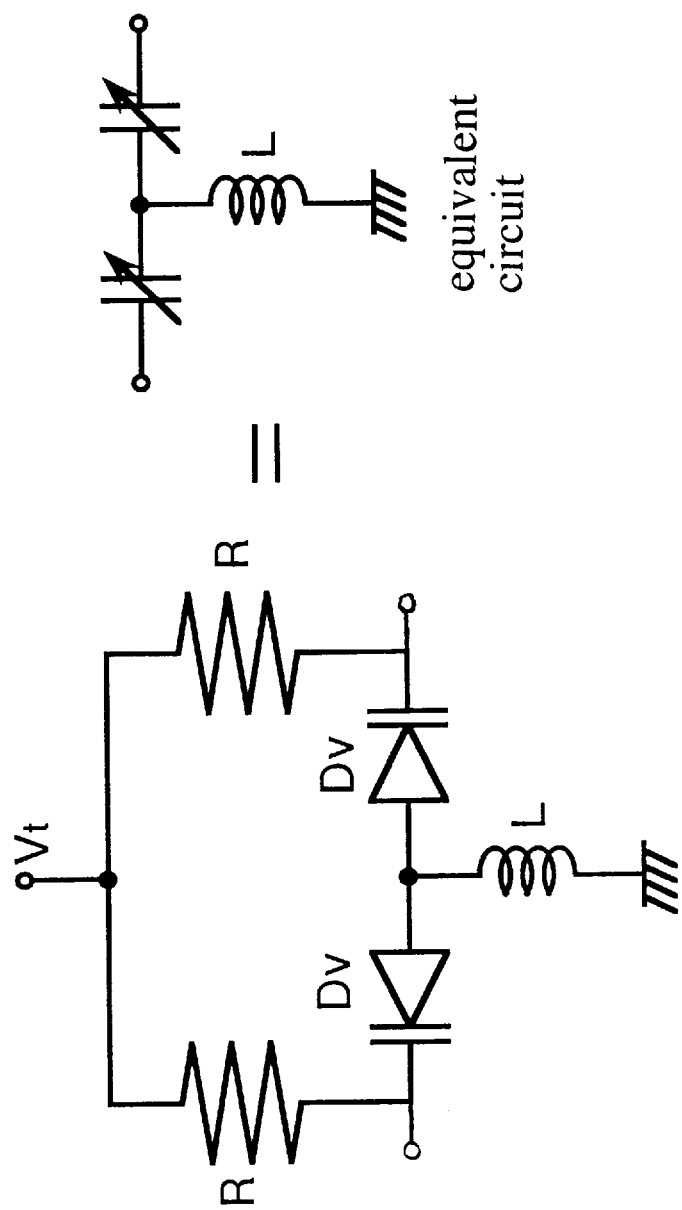
FIG. 5 is a view showing a construction of a variable phase shifter for use in the present invention.

An estimate of the presently required variation width $\Delta\Phi_V$ of the variable phase-shifter is now given. Generally, the phase-shifter 2 is composed of two varactor diodes $D_V$, one inductance L, and two resistors R as shown in FIG. 5. A varactor diode is an element whose capacitance changes in accordance with the bias voltage Vt. The presently available varactor diode has characteristics such that the capacitance C changes from 0.5 pF to about 4.5 pF when the bias voltage Vt is changed from 0 V to 20 V. A larger width in the capacitance variation can achieve a larger width $\Delta\Phi_V$ in the phase variation. Recently, an oscillation circuit having a sufficient capacitance variation width and phase variation width $\Delta\Phi_V$ with a small voltage variation $\Delta Vt$ is required because the oscillation circuit is now usually driven with a small voltage. However, generally employed oscillation circuits have a variation characteristics as mentioned above.

When a phase variation width $\Delta\Phi_V$ of the variable phase-shifter 2 is calculated in this example, it is found out that, in the frequency band of about 900 MHz which is usually employed for portable phones, $\Delta\Phi_V$ is about 140 degrees (when L=5 nH) in the case where $\Delta Vt$ is 20 V and that, in the frequency band of about 2450 MHz which is usually employed for wireless LAN, $\Delta\Phi_V$ is about 160 degrees (when L=3 nH). Actually, a further reduction in voltage is required, so that the value would be smaller than the above. Therefore, the phase variation width $\Delta\Phi_F$ within the passband of the ladder-type SAW filter 1 must be designed to be less than 150 to 160 degrees.

EXAMPLES

Next, a method for reducing the phase variation width $\Delta\Phi_F$ of the ladder-type SAW filter is now explained with reference to an embodiment of the present invention. The pass characteristics of the ladder-type SAW filter can be controlled by such values as the ratio (Cop/Cos) of the static capacitance Cop of the parallel arm SAW resonator relative to the static capacitance Cos of the adjacent series arm SAW resonator and the number n of stages connected in cascade configuration when the series arm SAW resonator and the parallel arm SAW resonator shown in FIG. 1 are counted as a unit. Generally, the insertion loss of the ladder-type SAW filter increases in accordance with the rise in the ratio of Cop/Cos and the number n, but the loss in the rejection-band increases, whereby the suppression outside the passband is greatly improved.

Figure 6:
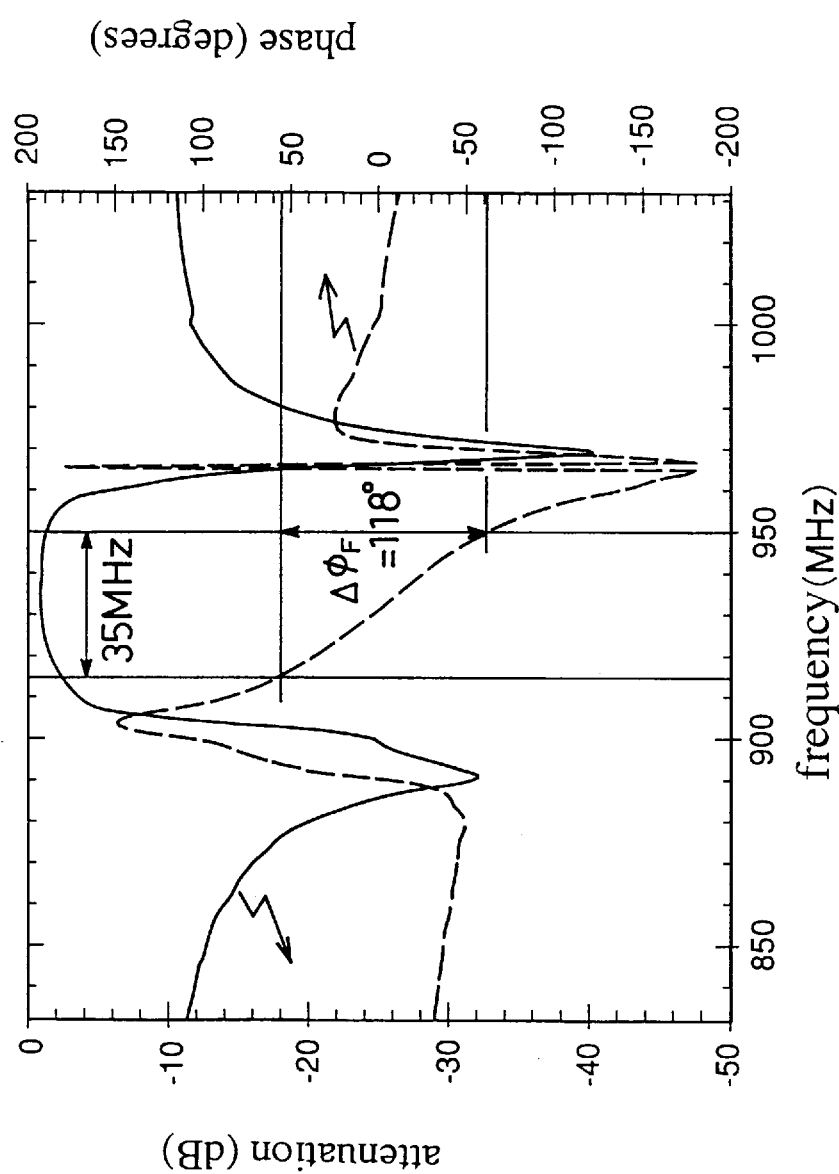
FIG. 6 is a graph showing the pass characteristics and the phase characteristics of a ladder-type SAW filter according to one embodiment of the present invention.
Figure 7:
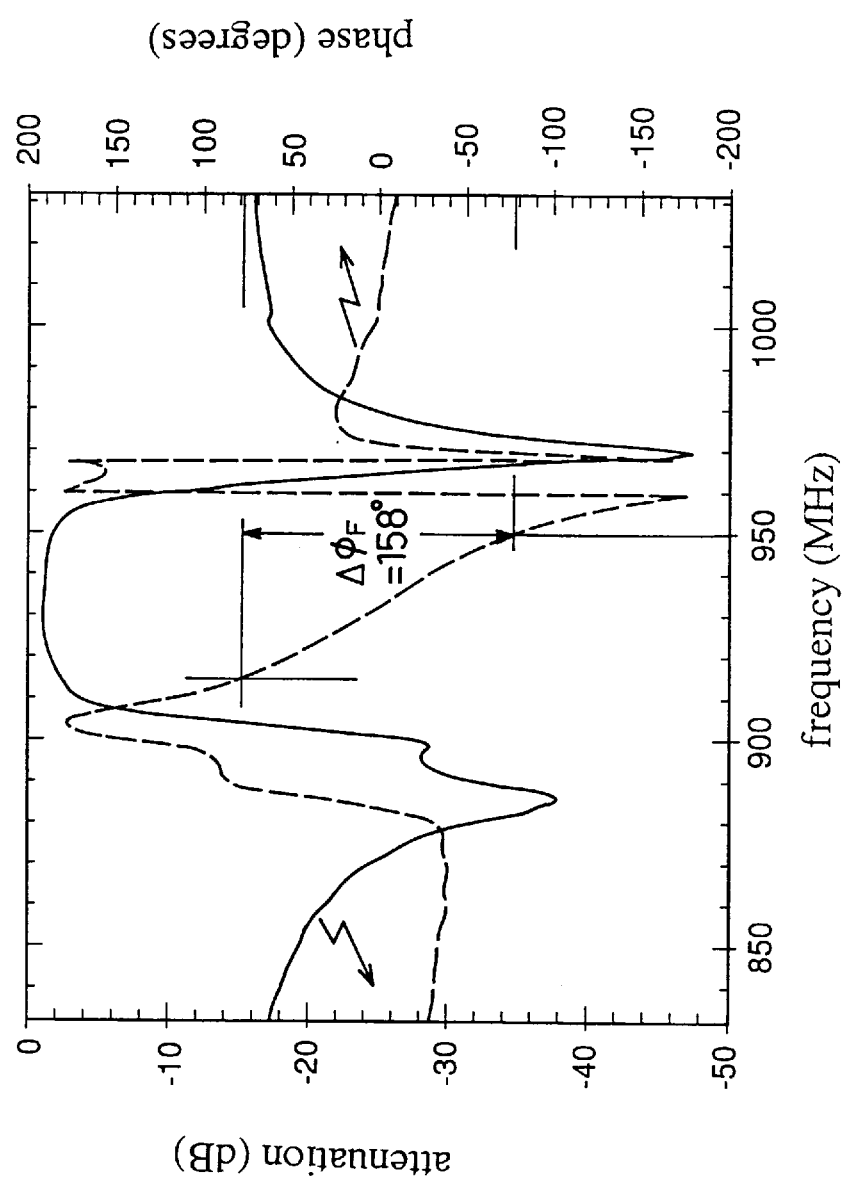
FIG. 7 is a graph showing the pass characteristics and the phase characteristics of a ladder-type SAW filter according to one embodiment of the present invention.
Figure 8:
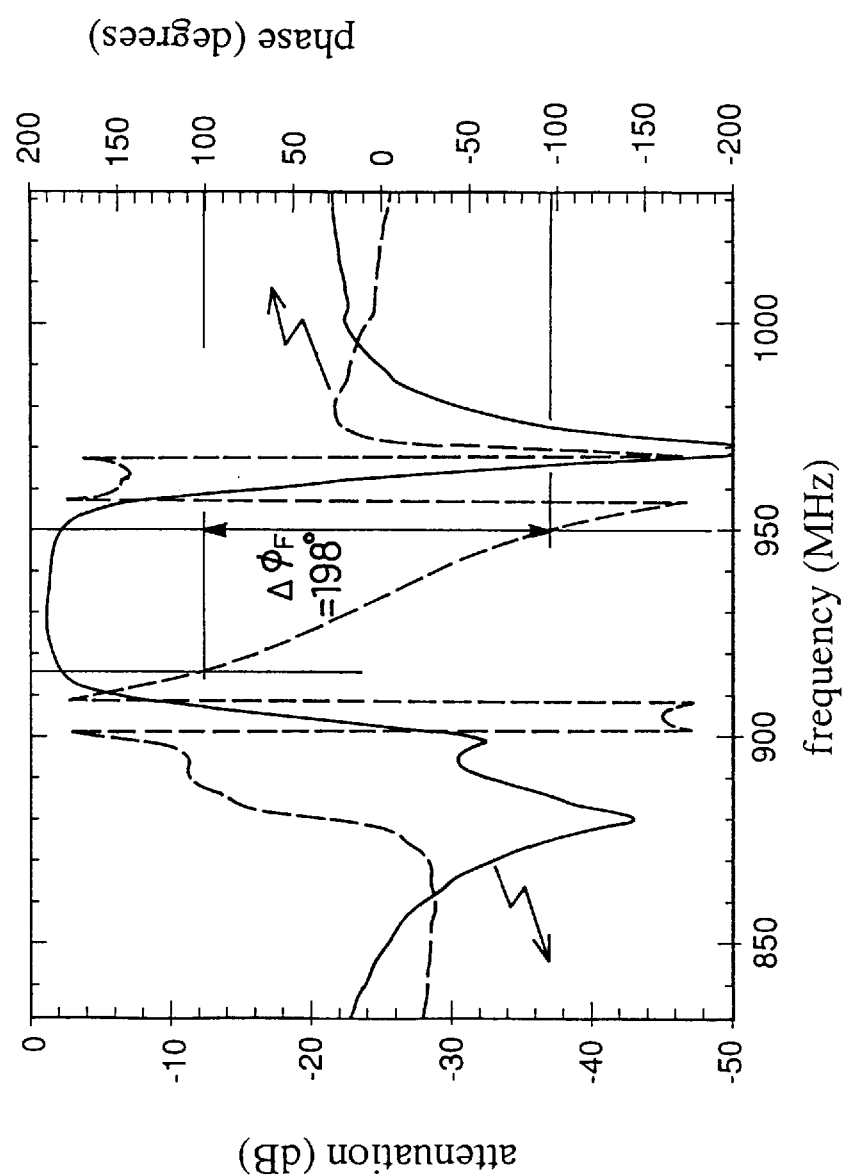
FIG. 8 is a graph showing the pass characteristics and the phase characteristics of a ladder-type SAW filter according to one embodiment of the present invention.

FIGS. 6, 7, and 8 show the change in amplitude and phase in the transmitting characteristics relative to the ratio Cop/Cos when n is fixed to be equal to 3. The three-stage cascade configuration in this case is the same as that shown in FIG. 2. In multi-stage configuration shown in FIG. 2, the units are connected stage by stage in inversion so that each stage will be symmetric for reduction of the loss and the like. This feature is explained in detail in the above-mentioned Japanese Unexamined Patent Publication No. Hei 05(1993)-183380.

In FIGS. 6, 7, and 8, the ladder-type SAW filter was formed on a LiTaO$_3$ substrate and the center frequency was set to be 932 MHz. FIG. 6 shows a case in which Cop/Cos is 0.33, FIG. 7 shows a case in which Cop/Cos is 0.58, and FIG. 8 shows a case in which Cop/Cos is 0.91.

Figure 9:
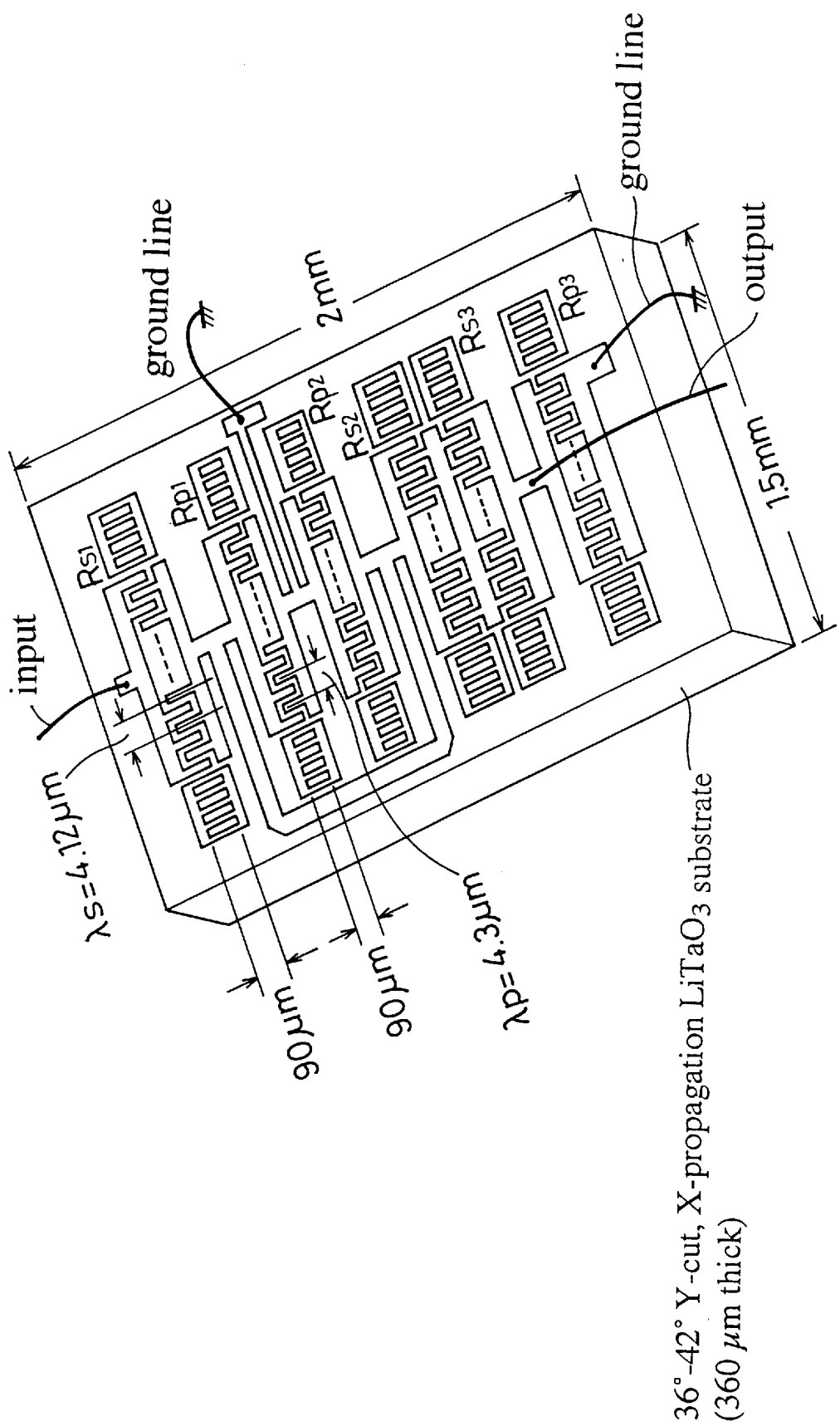
FIG. 9 is a view showing an outlook of a ladder-type SAW filter according to one embodiment of the present invention.

FIG. 9 is a view showing an outlook of a ladder-type SAW filter according to this embodiment. The ladder-type SAW filter is mounted in a ceramic package and is combined with a variable phase-shifter 2 and others to fabricate an oscillation circuit such as shown in FIG. 4.

FIG. 10 shows specific numerical values of the components of each SAW resonator in the ladder-type SAW filter illustrated in FIG. 9. Here, Rs1, Rs2, and Rs3 are SAW resonators in a series arm and Rp1, Rp2, and Rp3 are SAW resonators in a parallel arm.

Comparison of these figures shows that, in accordance with the rise in the ratio Cop/Cos, the insertion loss surely increases, but the suppression outside the passband is improved. On the other hand, as for the phase characteristics, it is shown that the phase variation width $\Delta\Phi_F$ of the ladder-type SAW filter decreases according as the ratio Cop/Cos decreases. The phase change that can cover the passband of 35 MHz (specific bandwidth being 3.7%) is about 158 degrees in the case of FIG. 7 where the ratio Cop/Cos is 0.58. Therefore, when the ratio Cop/Cos is smaller than the above value, it is possible to design an oscillation circuit having a sufficiently large bandwidth of variable frequency.

Figure 11:
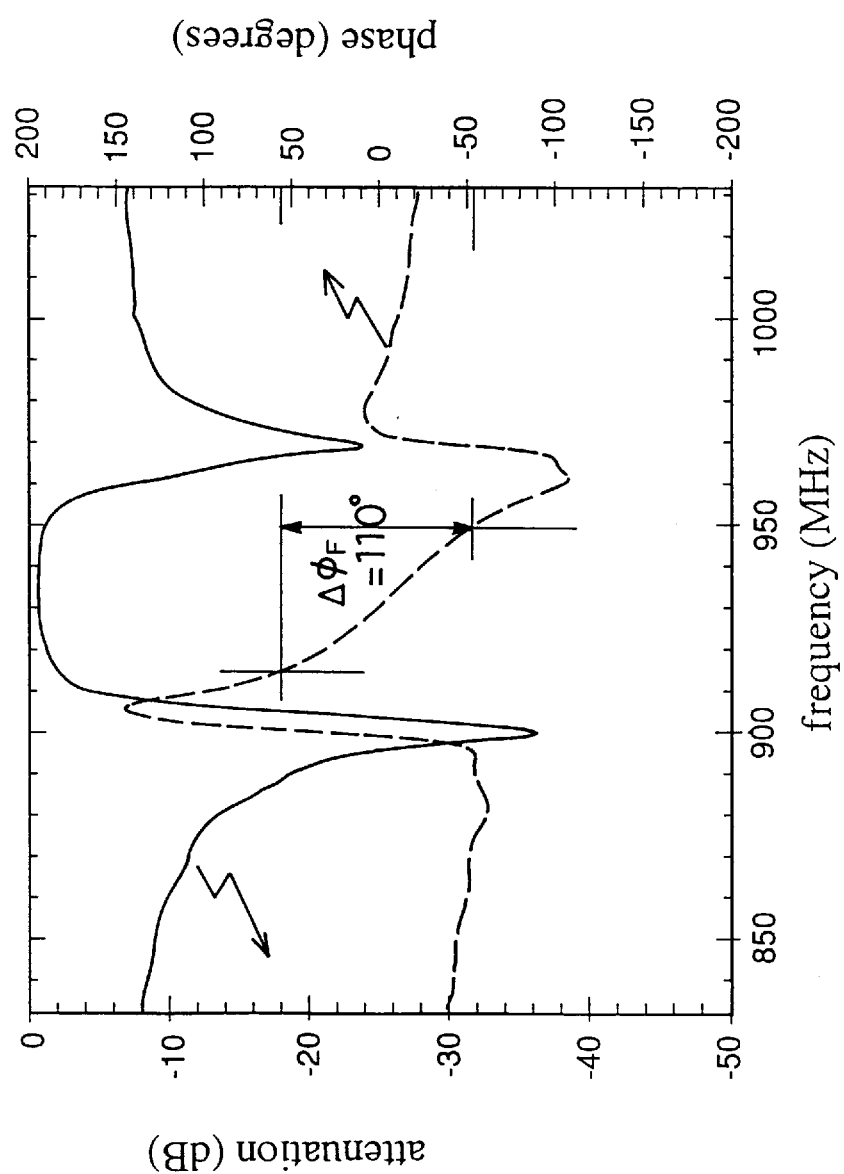
FIG. 11 is a graph showing the pass characteristics of a ladder-type SAW filter according to one embodiment of the present invention.
Figure 12A:
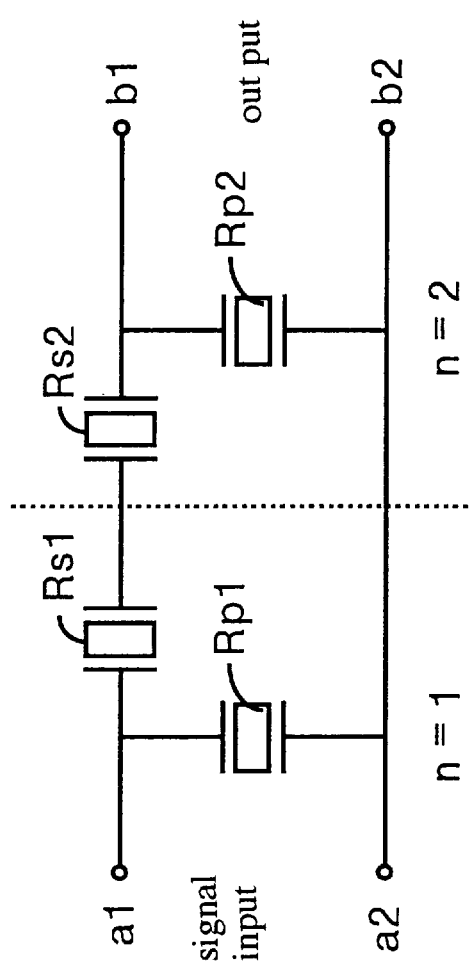
FIG. 12(a) is an explanatory view showing a multi-stage inversion connection (n=2) of the ladder-type SAW filter illustrated in FIG. 11.
Figure 12B:
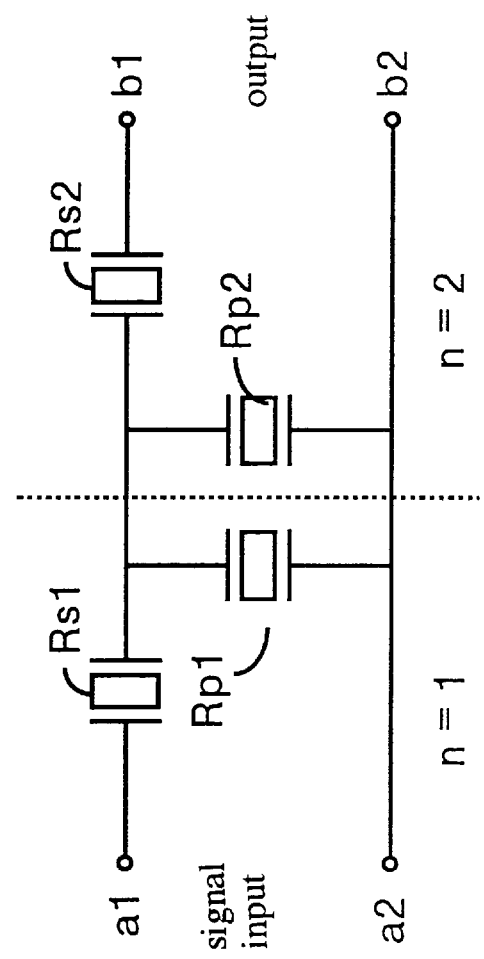
FIG. 12(b) is an explanatory view showing a multi-stage inversion connection (n=2) of the ladder-type SAW filter illustrated in FIG. 11.
Figure 13:
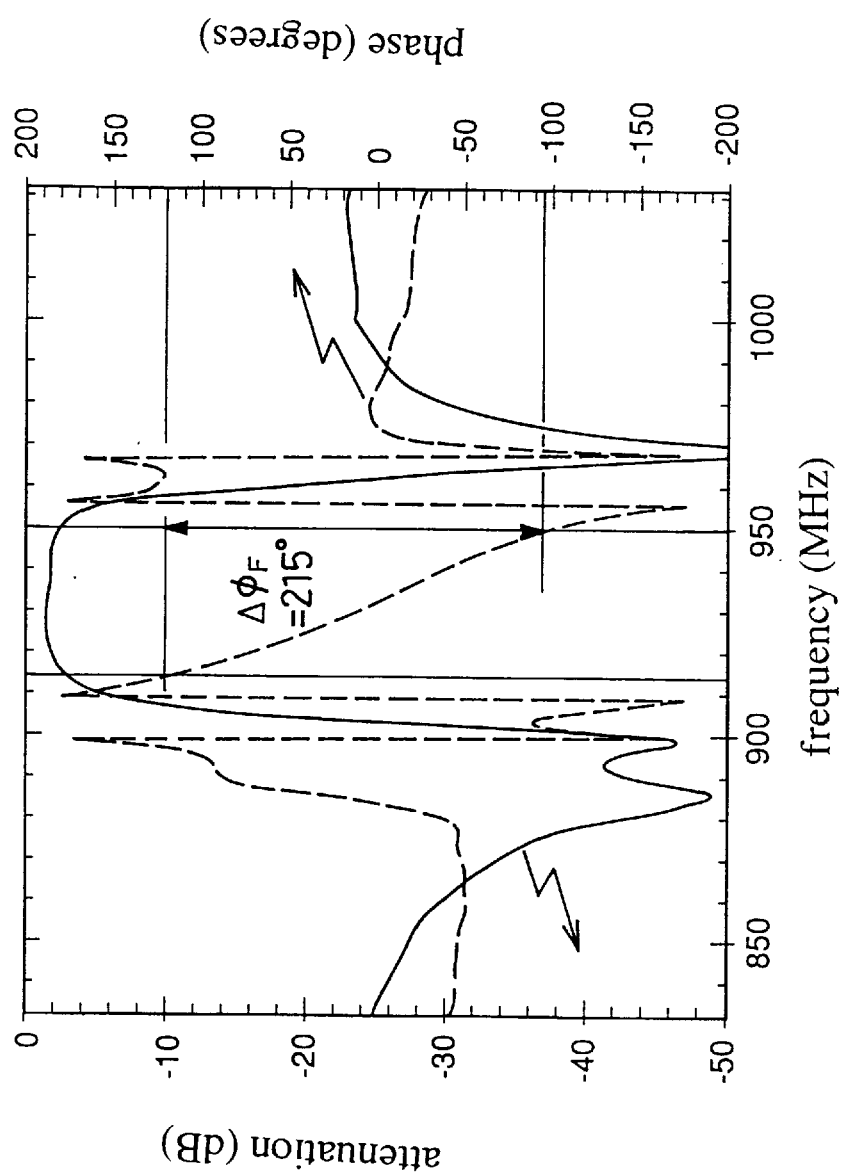
FIG. 13 is a graph showing the pass characteristics of a ladder-type SAW filter according to one embodiment of the present invention.
Figure 14A:
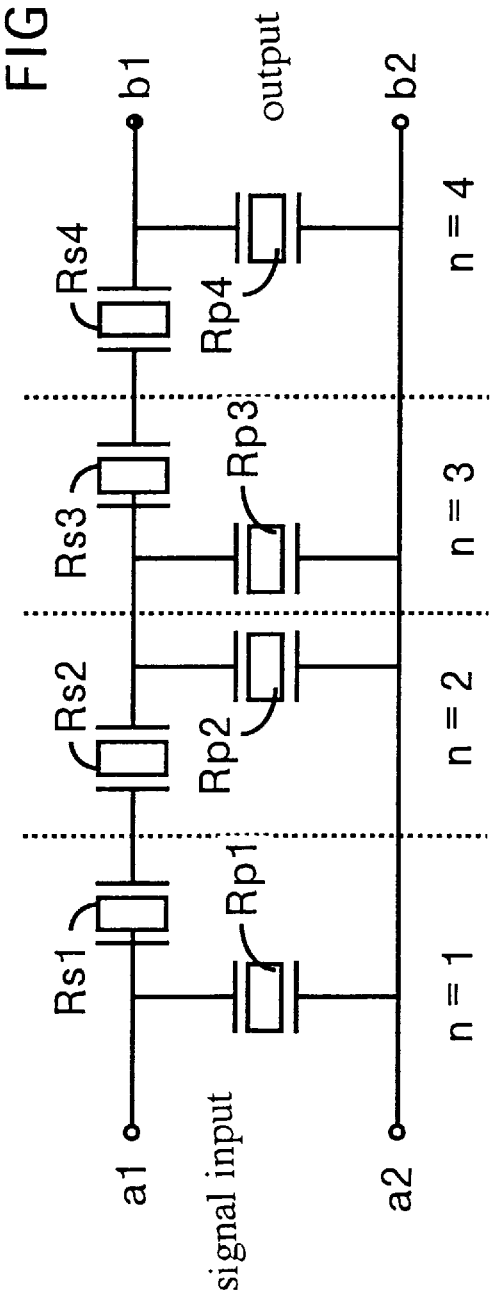
FIG. 14(a) is an explanatory view showing a multi-stage inversion connection (n=4) of the ladder-type SAW filter illustrated in FIG. 13.
Figure 14B:
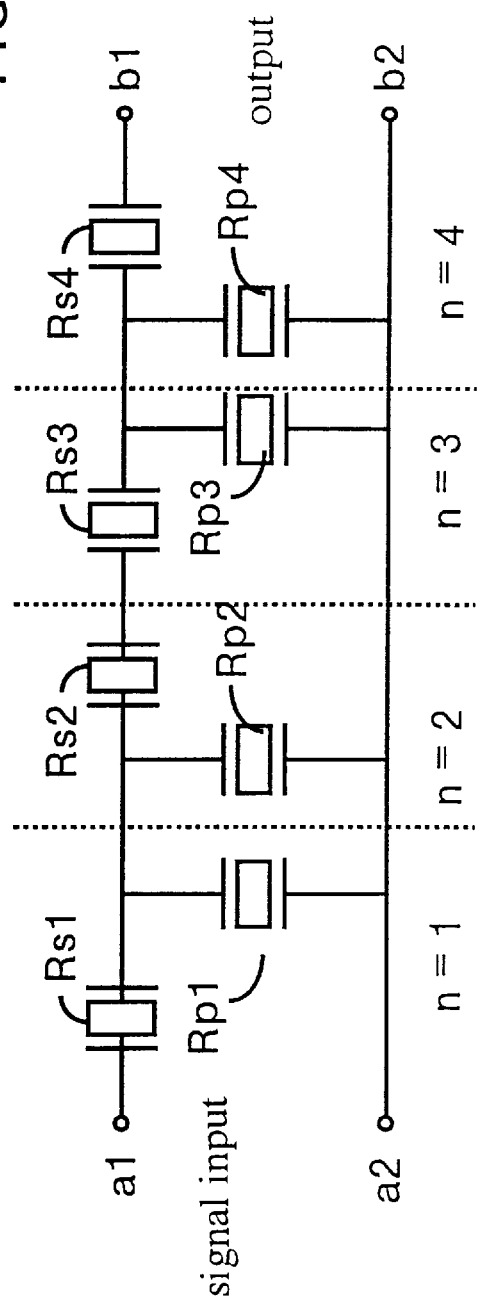
FIG. 14(b) is an explanatory view showing a multi-stage inversion connection (n=4) of the ladder-type SAW filter illustrated in FIG. 13.

FIG. 11 shows transmitting characteristics of a ladder-type SAW filter when the ratio Cop/Cos is fixed to be 0.58 and the number n is 2. FIG. 12(a) and 12(b) show circuit construction of this ladder-type SAW filter. FIG. 13 shows transmitting characteristics of a ladder-type SAW filter when the ratio Cop/Cos is 0.58 and the number n is 4. FIG. 14(a) and 14(b) show circuit construction of this ladder-type SAW filter.

According as the number n increases, the insertion loss increases, but the suppression outside the passband is improved, as in the case of Cop/Cos. As for the phase characteristics, it is found out that the phase variation width $\Delta\Phi_F$ decreases according as the number n decreases, which is convenient for the oscillation circuit.

Specifically, as shown in FIGS. 11, 7, and 13, the phase change $\Delta\Phi_F$ is smaller than 158 degrees if the number n is 3 or less. From the above, it is understood that the condition: Cop/Cos<0.58 or n<3 must be satisfied in order to maintain the phase change width $\Delta\Phi_F$ to be less than 160 degrees with respect to the passband of the ladder-type SAW filter.

FIG. 15 shows measurements of the phase change width $\Delta\Phi_F$ with respect to other Cop/Cos and n. In FIG. 15, the vertical axis represents Cop/Cos and the horizontal axis represents n. Each of the dots in FIG. 15 shows the phase change width $\Delta\Phi_F$ at which the fractional bandwidth of the transmitting characteristics of the ladder-type SAW filter is about 3.7%. Here, half integers such as n=1.5, 2.5, 3.5, 4.5, and so on with a fraction 0.5 represent states in which either a series arm SAW resonator or a parallel arm SAW resonator is further connected to integer-multiple stages in cascade configuration. However, n=0.5 does not form a band-pass filter and is meaningless. FIG. 15 shows, for example, that the phase change width $\Delta\Phi_F$=190 degrees when Cop/Cos= 1.5 and n=2.

From FIG. 15, the relationship between Cop/Cos and n satisfying the equality $\Delta\Phi_F$=160 degrees is determined and is shown as a curve. The region below the curve shows Cop/Cos and n satisfying the relation $\Delta\Phi_F<160$ degrees. This region corresponds to a condition such that an oscillation circuit having a wide bandwidth of variable frequency can be designed. The condition is specifically represented by the following inequality:

$$Cop/Cos < -0.32 + 2.82/n \qquad (3)$$

In the case where a ladder-type SAW filter is formed on a LiTaO$_3$ substrate in such a manner that the above inequality (3) is satisfied, it is possible to realize an oscillation circuit having a wide bandwidth of variable frequency with the specific bandwidth of about 3.7% even if a presently available phase-shifter is employed.

Next, regarding the inequality (3), explanation is given on embodiments in which the frequency and the like have been altered. First, the dependency of the center frequency is explained. The inequality (3) is a rule that holds independently of the center frequency once the substrate material is determined. In order to specifically demonstrate the above rule, an oscillation circuit was fabricated employing a ladder-type SAW filter with the center frequency of 2430 MHz, Cop/Cos=0.3, and n=3 formed on a similar LiTaO$_3$ substrate.

Figure 16:
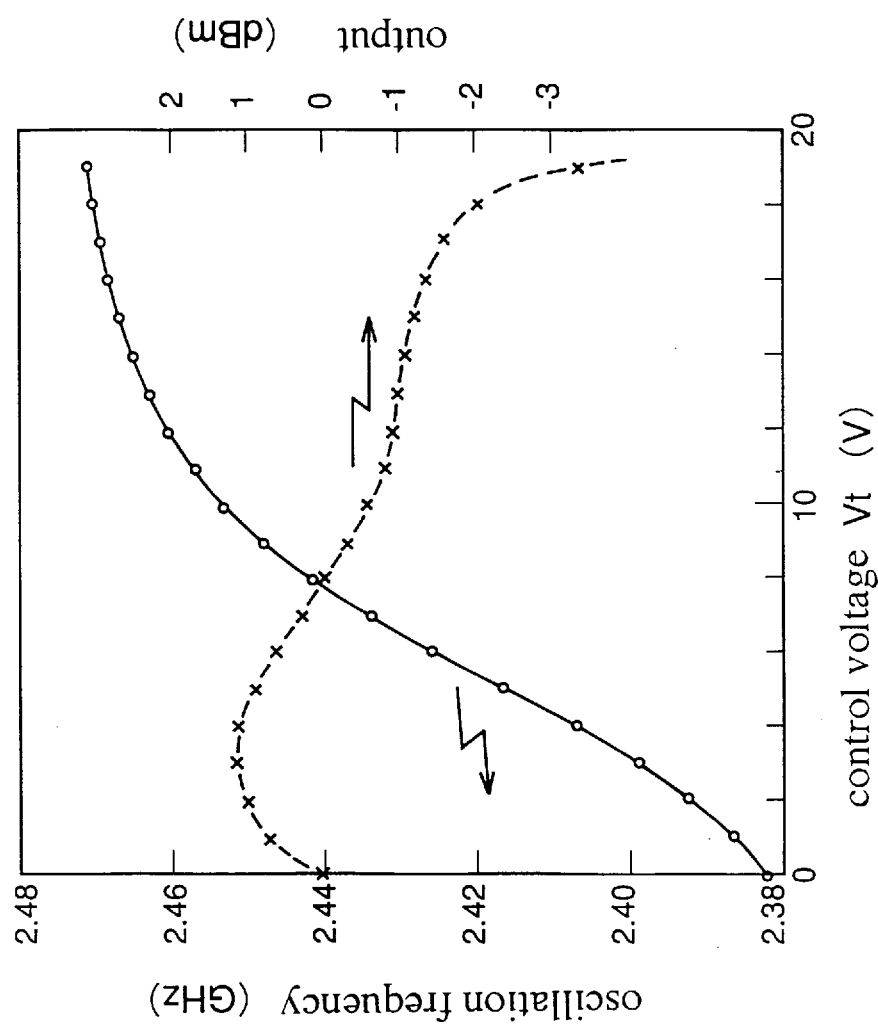
FIG. 16 is a graph showing the oscillation frequency and the oscillation output power relative to the control voltage Vt according to one embodiment of the present invention.

FIG. 16 shows a relationship between the control voltage Vt and the oscillation frequency of the oscillation circuit and a relationship between the control voltage Vt and the oscillation output power. From FIG. 16, it is understood that it is possible to realize 88 MHz (=2470–2382 MHz) as a bandwidth of frequency being variable until the output power is deteriorated to −3 dB, which corresponds to a specific bandwidth of about 3.7% (=88/2430).

Figure 17:
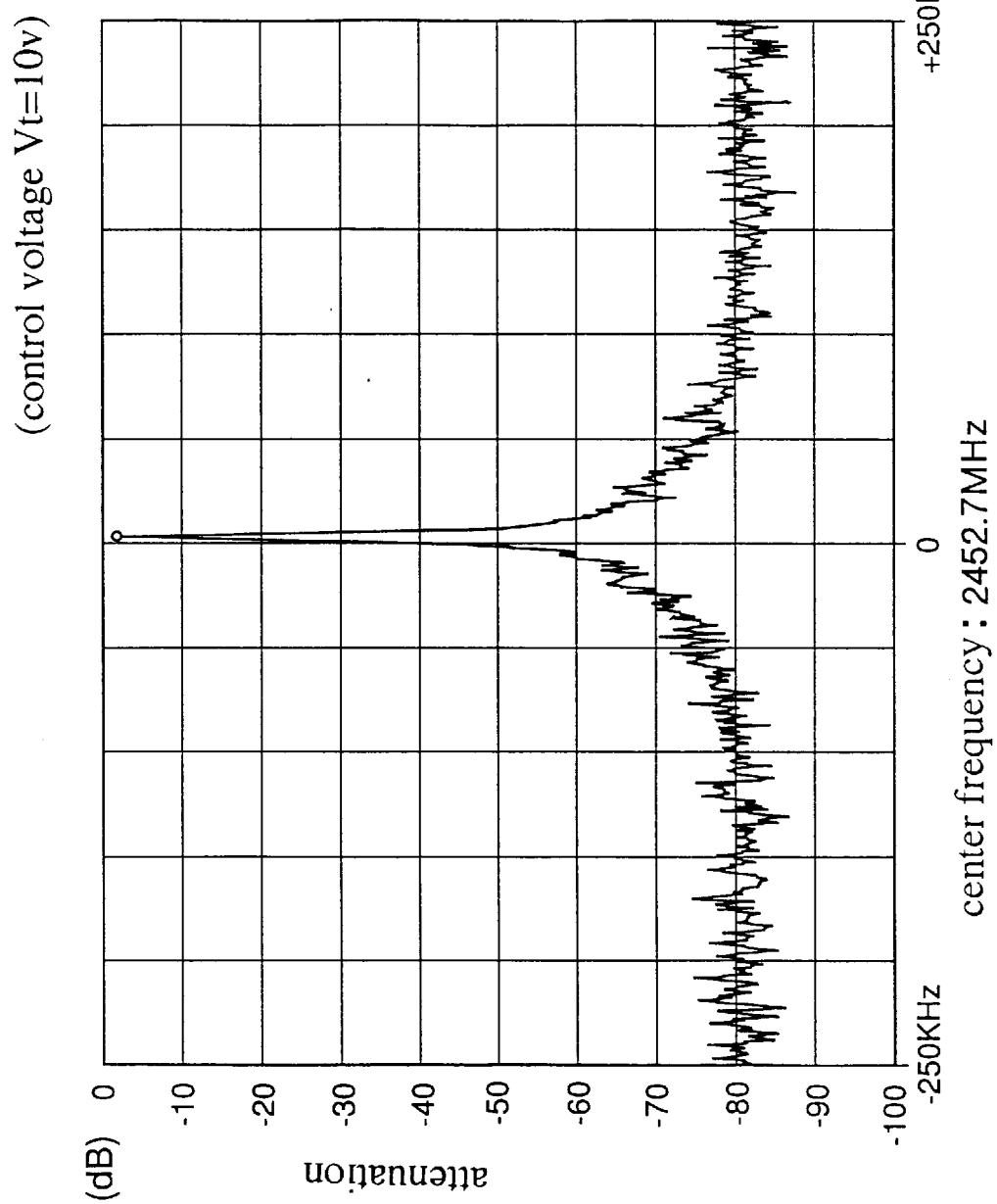
FIG. 17 is a graph showing the oscillation spectrum (control voltage Vt=10 V) according to one embodiment of the present invention.

FIG. 17 shows an oscillation spectrum of the oscillation circuit at the control voltage of Vt=10 V. From this, it is understood that good characteristics of over 70 dB as a C/N ratio at a offset frequency of 50 KHz and a resolving frequency of 1 KHz have been obtained. This shows that the design condition of (3) is not dependent on the center frequency.

Figure 18:
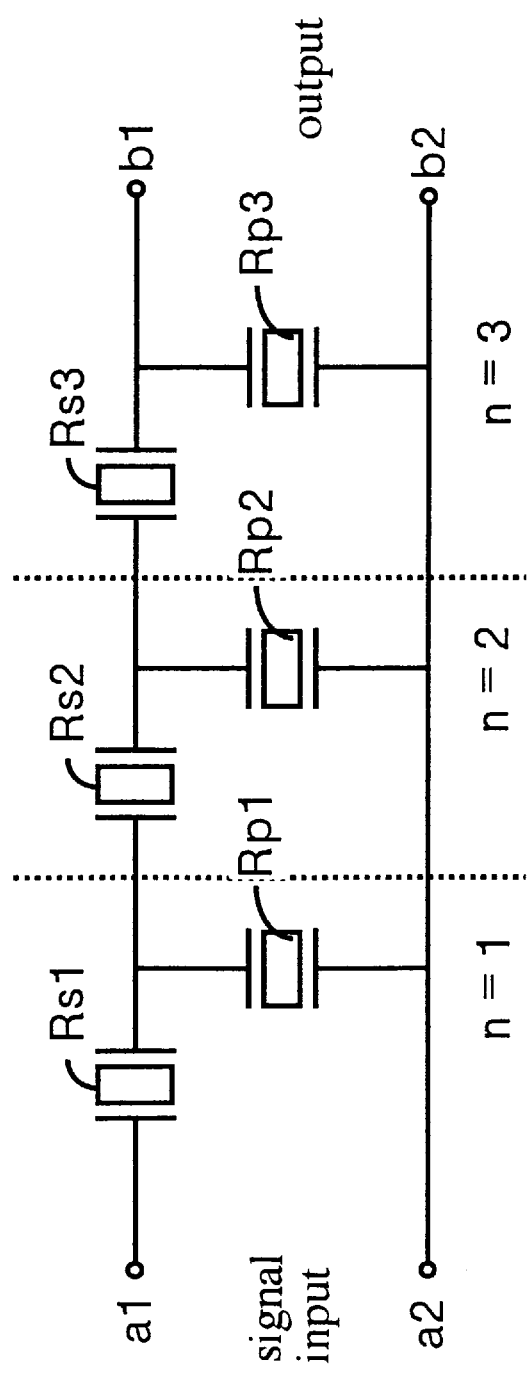
FIG. 18 is an explanatory view showing a normal multi-stage connection according to the present invention.

Next, explanation is now given on the difference of connecting method. FIG. 15 shows a case which employs a filter having multiple SAW resonator units connected stage by stage in inversion as shown in FIGS. 12(a), 12(b), 14(a) and 14(b). However, it is possible to utilize a normal connection method as shown in FIG. 18 in which the SAW resonator units are not connected in inversion. Also in this case, an oscillation circuit satisfying the relation (3) can be constructed.

Further, the inversion connection shown in FIG. 2 can be considered as a normal connection if two adjacent series arm resonators are considered as one series arm resonator and two adjacent parallel arm resonators are considered as one parallel arm resonator. This is also described in detail in Japanese Unexamined Patent Publication No. Hei 05(1993)-183380.

Figure 19:
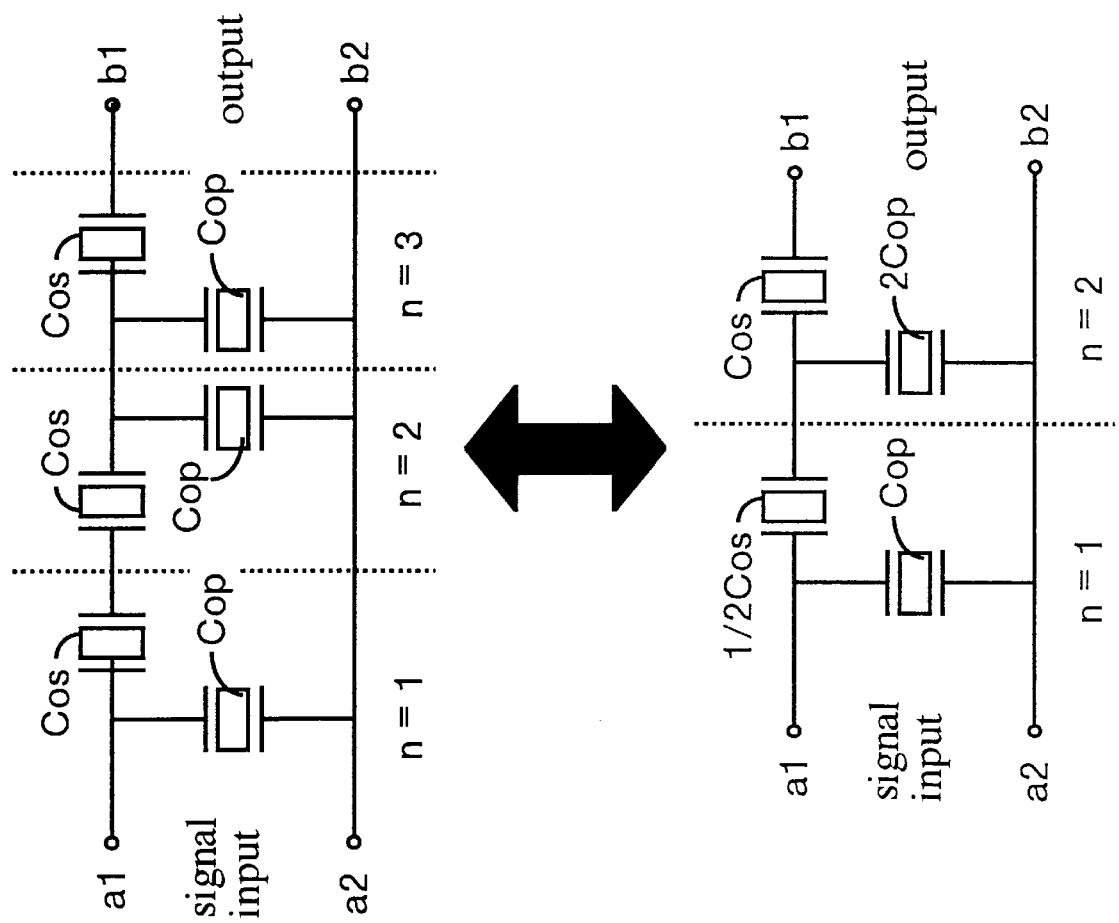
FIG. 19 is an explanatory view showing a normal multi-stage connection according to the present invention.

For example, in FIG. 19, the static capacitance ratio Cop/Cos of the adjacent series and parallel arm resonators appears to be twice as much. Accordingly, the filter must be designed so that the ratio Cop/Cos corrected for the original inversion connection as shown in FIG. 2 satisfies the condition of the inequality (3).

Figure 20:
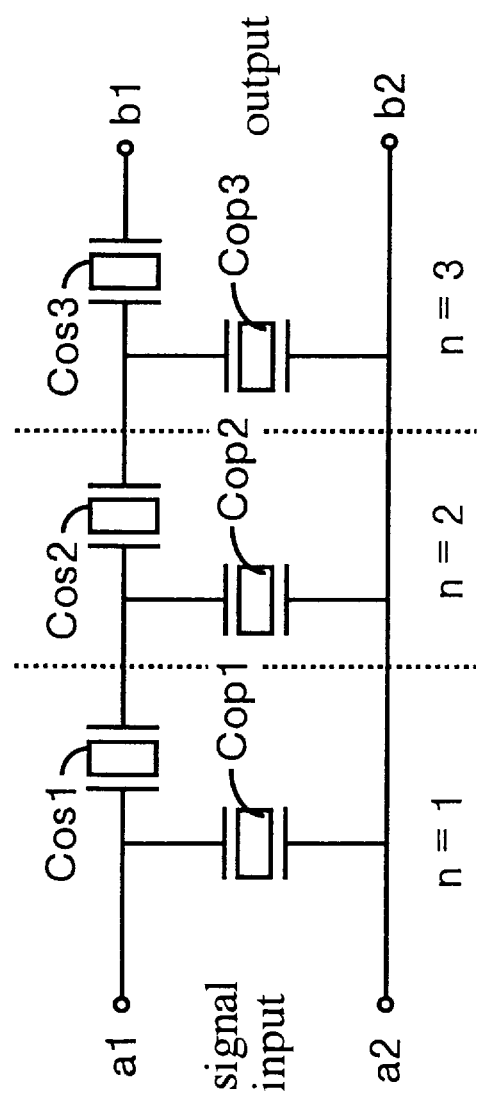
FIG. 20 is an explanatory view showing a normal multi-stage connection according to the present invention.
Figure 21:
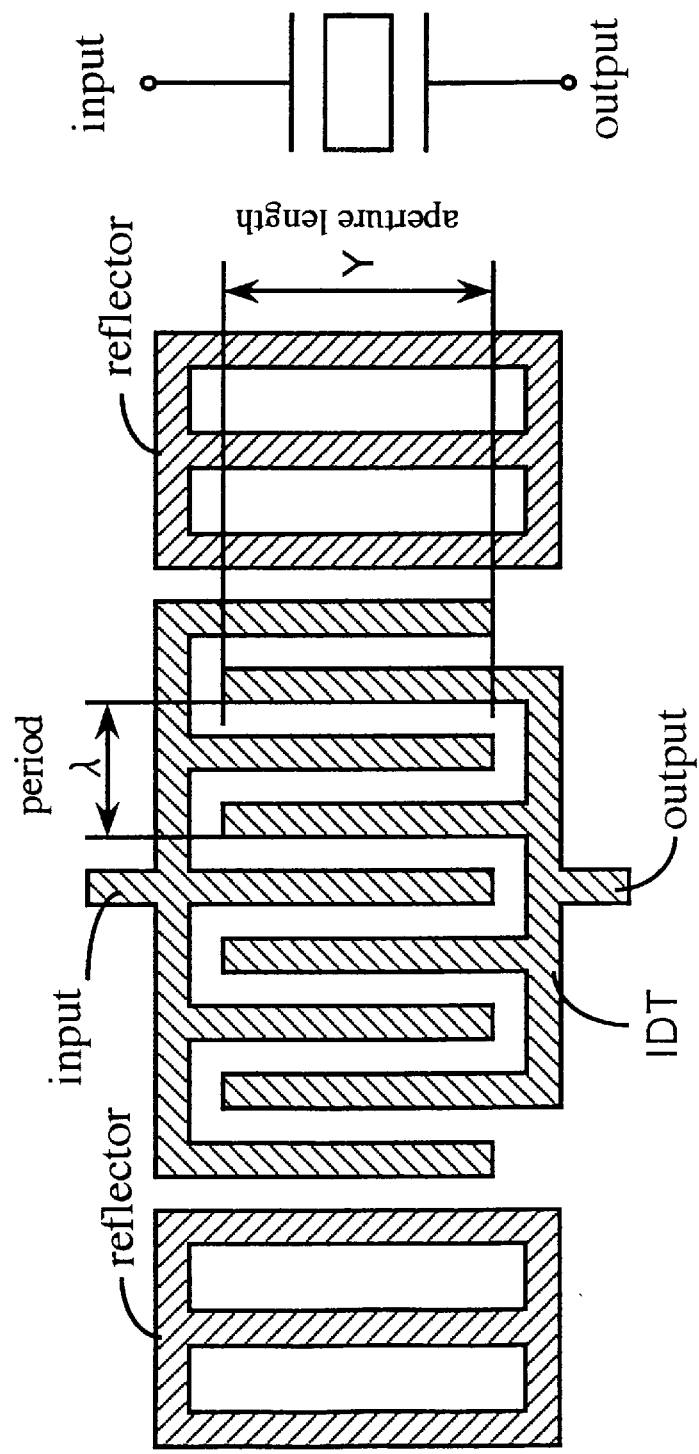
FIG. 21 is a view showing a construction of a conventional one-port surface acoustic wave resonator.
Figure 22:
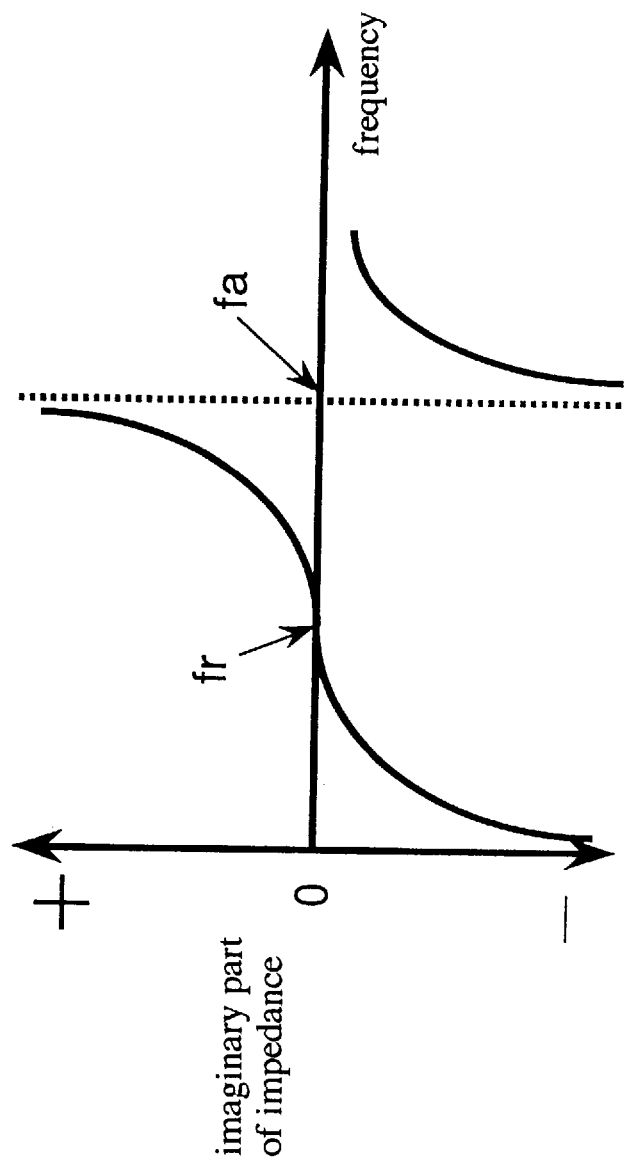
FIG. 22 is a view showing impedance characteristics of a conventional one-port surface acoustic wave resonator.
Figure 23:
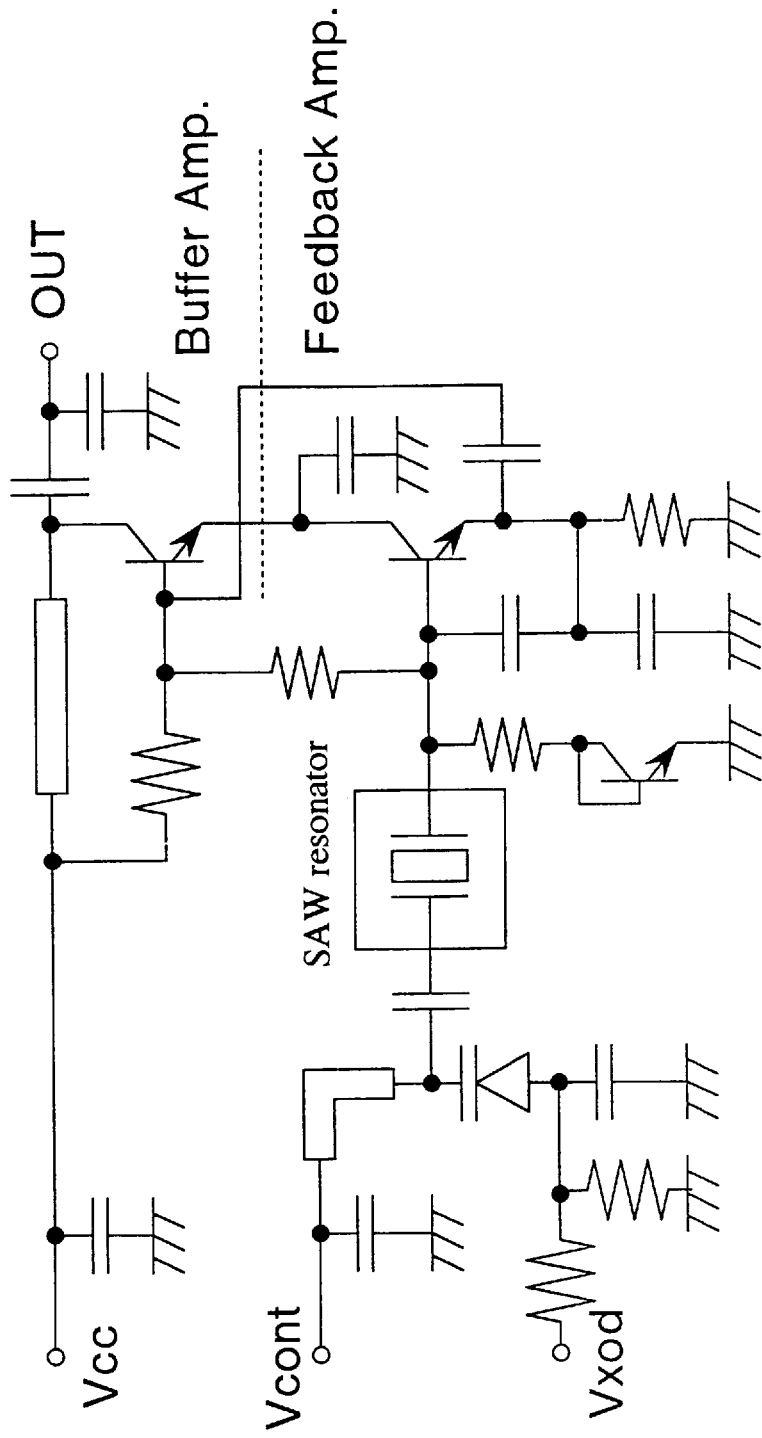
FIG. 23 is a circuit diagram of VCO employing a conventional one-port surface acoustic wave resonator.

Also, there may be cases where the static capacitances Cop and Cos are different stage by stage as shown in FIG. 20. Even in such a case, the phase characteristics would not be greatly different if the filter is designed so that the arithmetic mean of the ratio Cop/Cos in the stages satisfies the inequality (3). In other words, if the number of stages is n and the ratio Cop/Cos in each stage i is represented by Copi/Cosi, the ratio Cop/Cos as an arithmetic mean would be expressed as follows:

$$Cop/Cos = \left( \sum_{i=1}^{n} Copi/Cosi \right)/n$$

Further, the condition of the inequality (3) holds universally for different substrate materials. Therefore, it is easy to obtain a further large bandwidth of variable frequency if the ladder-type SAW filter satisfying the condition of the inequality (3) is fabricated by employing LiNbO$_3$ or KNbO$_3$ which is a material having a larger electromechanical coupling factor than LiTaO$_3$.

For example, the electromechanical coupling factor is about 5% in the case of a 36 degrees to 42 degrees Y-cut LiTaO$_3$, 11% in the case of 64 degrees Y-cut LiNbO$_3$, and 17% in the case of 41 degrees Y-cut LiNbO$_3$. The bandwidth of variable frequency is enlarged approximately in proportion to the electromechanical coupling factor. This is because the difference of anti-resonance frequency $f_a$—resonance frequency $f_r$ increases in proportion to the electromechanical coupling factor, as described above.

It is possible to realize an oscillation circuit with the fractional bandwidth of about 8.1% by employing a 64 degrees Y-cut LiNbO$_3$ and an oscillation circuit with the fractional bandwidth of 12.6% by employing a 41 degrees Y-cut LiNbO$_3$. Also, it is reported in a recent article (for example, a report by Kazuhiko Yamanouchi et al.. General meeting of Electronic Data Communication Society, 1997, A-11-8, p.283) that a Y-cut, X-propagation KNbO$_3$ has an electromechanical coupling factor of 53%. By employing this substrate material, it is possible to realize an oscillation circuit of super wide band with a specific bandwidth of about 40%.

The present invention makes it possible to construct an oscillation circuit having a large bandwidth of variable frequency because surface acoustic wave filters connected in cascade configuration are employed in a feedback circuit section of the phase-shift oscillation circuit.

Specifically, an oscillation circuit having a high C/N ratio and a large bandwidth of variable frequency can be provided by approximately equating the anti-resonance frequency $f_{ap}$ of the one-port surface acoustic wave resonator in the parallel arm with the resonance frequency $f_{rs}$ of the one-port surface acoustic wave resonator in the series arm. Also, it is possible to realize an oscillation circuit having an extremely larger bandwidth of variable frequency than ever, with the fractional bandwidth of 30 to 40% if LiTaO$_3$, LiNbO$_3$, or KNbO$_3$ having a high electromechanical coupling factor is employed as a substrate material for the surface acoustic wave filter.

What we claim is:

1. An oscillation circuit of phase-shift type comprising a surface acoustic wave filter in a feedback circuit, the surface acoustic wave filter having first and second one-port surface acoustic wave resonators of different resonance frequencies connected in a ladder configuration.

2. An oscillation circuit according to claim 1, wherein the surface acoustic wave filter includes a plurality of the first one-port surface acoustic wave resonators disposed in a parallel arm and a plurality of the second one-port surface acoustic wave resonators disposed in a series arm, the first one-port surface acoustic wave resonators each having a predetermined resonance frequency $f_{rp}$ and an anti-resonance frequency $f_{ap}$, and the second one-port surface acoustic wave resonators each having a resonance frequency $f_{rs}$ approximately equal to the anti-resonance frequency $f_{as}$.

3. An oscillation circuit according to claim 2, wherein the resonance frequency $f_{rs}$ of the second one-port surface acoustic wave resonator in the series arm is larger than the anti-resonance frequency $f_{ap}$ of the first one-port surface acoustic wave resonator in the parallel arm and a value obtained by normalizing a difference $\Delta f = f_{rs} - f_{ap}$ with the resonance frequency $f_{rs}$ is greater than 0 and smaller than $\alpha$ which is given by the following formula:

$$\alpha = 1 / \left( \sqrt{Cop(\gamma^2 + \gamma)/(0.06 \cdot Cos)} \right) - \gamma,$$

wherein Cop represents a static capacitance of the first one-port surface acoustic wave resonator in the parallel arm, Cos represents a static capacitance of the second one-port surface acoustic wave resonator in the series arm, and $\gamma$ represents a capacitance ratio.

4. An oscillation circuit according to claim 2 or 3, wherein the first one-port surface acoustic wave resonator and the second one-port surface acoustic wave resonator are designed to satisfy the following inequality:

$$Cop/Cos < -0.32 + 2.82/n,$$

wherein Cop represents a static capacitance of the first one-port surface acoustic wave resonator in the parallel arm, Cos represents a static capacitance of the second one-port surface acoustic wave resonator in the series arm, and n is the number of stages connected in cascade configuration when the first one-port surface acoustic wave resonator and the second one-port surface acoustic wave resonator are counted as a unit.

5. An oscillation circuit according to claim 4, wherein an arithmetic mean of Cop/Cos in the stages is smaller than $-0.32 + 2.82/n$ if the value Cop/Cos of the pair of the first and second one-port surface acoustic wave resonators differs from stage to stage.

6. An oscillation circuit according to claim 1 or 2, wherein a phase change of phase characteristics in the passband of the surface acoustic wave filter is within the range of 0 degrees to 160 degrees.

7. An oscillation circuit according to claim 4, wherein a phase change of phase characteristics in the passband of the surface acoustic wave filter is within the range of 0 degrees to 160 degrees.

8. An oscillation circuit according to claim 1, 2, or 3, wherein the surface acoustic wave filter is formed on a piezoelectric single-crystal substrate selected from the group consisting of $LiTaO_3$, $LiNbO_3$, and $KNbO_3$.

9. An oscillation circuit according to claim 4, wherein the surface acoustic wave filter is formed on a piezoelectric single-crystal substrate selected from the group consisting of $LiTaO_3$, $LiNbO_3$, and $KNbO_3$.

10. An oscillation circuit according to claim 5, wherein the surface acoustic wave filter is formed on a piezoelectric single-crystal substrate selected from the group consisting of $LiTaO_3$, $LiNbO_3$, and $KNbO_3$.

11. An oscillation circuit according to claim 6, wherein the surface acoustic wave filter is formed on a piezoelectric single-crystal substrate selected from the group consisting of $LiTaO_3$, $LiNbO_3$, and $KNbO_3$.

12. An oscillation circuit according to claim 7, wherein the surface acoustic wave filter is formed on a piezoelectric single-crystal substrate selected from the group consisting of $LiTaO_3$, $LiNbO_3$, and $KNbO_3$.

\* \* \* \* \*